(12) United States Patent
Farquhar et al.

(10) Patent No.: US 6,501,171 B2
(45) Date of Patent: Dec. 31, 2002

(54) FLIP CHIP PACKAGE WITH IMPROVED CAP DESIGN AND PROCESS FOR MAKING THEREOF

(75) Inventors: Donald S. Farquhar, Endicott, NY (US); David E. Houser, Apalachin, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/774,152

(22) Filed: Jan. 30, 2001

(65) Prior Publication Data

US 2002/0100969 A1 Aug. 1, 2002

(51) Int. Cl.[7] .......................... H01L 23/34; H01L 23/52
(52) U.S. Cl. ...................... 257/706; 257/717; 257/712; 257/783
(58) Field of Search ................... 257/722, 787, 257/698, 706, 712, 717, 659, 783; 438/122, 125

(56) References Cited

U.S. PATENT DOCUMENTS

| 5,213,868 A | 5/1993 | Liberty et al. ............... 428/131 |
| 5,485,037 A | 1/1996 | Marrs .......................... 257/712 |
| 5,745,344 A | 4/1998 | Baska et al. ................. 361/705 |
| 5,777,847 A | 7/1998 | Tokuno et al. ............... 257/713 |
| 5,821,628 A | * 10/1998 | Hotta .......................... 257/783 |
| 5,877,043 A | 3/1999 | Alcoe et al. ................. 438/123 |
| 6,104,093 A | 8/2000 | Caletka et al. .............. 257/778 |
| 6,294,831 B1 | * 9/2001 | Shishido et al. ............. 257/729 |

* cited by examiner

*Primary Examiner*—Jasmine J B Clark
(74) *Attorney, Agent, or Firm*—Scully, Scott, Murphy & Presser; Lawerence Fraley, Esq.

(57) ABSTRACT

Wire bond packages which mount encapsulated semiconductor chips, such as plastic ball grid array (PBGA) packages providing for the mounting of so-called flip-chips. The chips are overlaid with heat spreading perforated cap wherein the perforations are filled with an adhesive to prevent delamination caused by mismatches in the coefficients of thermal expansion, resulting in contractions which cause the entire package arrangement to warp, leading to delamination between an encapsulant and cap and resulting in failure of connect joints and the ball grid arrays.

36 Claims, 2 Drawing Sheets

//www.w3.org/1999/xhtml">
FLIP CHIP PACKAGE WITH IMPROVED CAP DESIGN AND PROCESS FOR MAKING THEREOF

BACKGROUND OF THE INVENTION

1. Field of the Invention

The present invention relates, in general, to organic laminate chip carrier packages which mount encapsulated semiconductor chips, such as plastic ball grid array (PBGA) packages providing for the mounting of so-called flip-chips, and wherein the chips are usually overlaid with a heat spreading cap designed to balance the coefficients of thermal expansion (CTE) and the stiffness of a substrate which is exposed on sides opposite of the chips, in order to compensate for mismatches in the coefficients of thermal expansion, and resulting in contractions which cause the entire package arrangement to warp, leading to delamination between an encapsulant and cap and resulting in failure of connect joints and the ball grid arrays.

The concept of compensating for any mismatches in coefficients of thermal expansion (CTE) and resultant contraction which are encountered between the various components of a wire bond or flip chip package or module including encapsulated semiconductor chips mounted on substrates, and with heat sinks supported on the chips in the form of caps in order to reduce heat-induced warpage tending to separate the components and leading to failures of the electrical connects and ball grid arrays adversely affecting the functioning and reliability of the packages has been widely addressed in the technology and industry. Nevertheless, notwithstanding the considerable efforts expended in order to solve the problems which are encountered, the utilization of the heat-spreading caps or heat sinks has only been partially successful in maintaining the relative flatness of the components and avoiding warping, inasmuch as the heat-spreading cap only balances the thermal dissipation above the substrate directly above the chip. The foregoing difficulties are encountered due to package warping as a result of thermal stresses generated, in that the normally utilized epoxy adhesives which cement the chip and cap to the substrate may not match the coefficients of thermal expansion of the substrate. One of the possible failure mechanisms is delamination of the epoxy interface between the chip and the cap as a result of thermally induced thermal stresses. Also, the tendency of the epoxy adhesive to absorb or desorb moisture may readily cause additional expansion and contraction and result in further warpage of the entire module structure, leading to an operative failure of the arrangement.

2. Discussion of the Prior Art

At this time, various types of structures have been employed in the technology which concern themselves with the provision of means for dissipating heat which is generated during the operation of the module, and to avoid thermal expansions and contractions which would conceivably cause the module to warp, leading to operative failure and/or reduction in the service life thereof.

In particular, the semiconductor chips have been equipped with superimposed heat sinks in the form of so-called caps or covering structures which are adhesively fastened thereto; for example, such as through the interposition of an epoxy adhesives or the like, and wherein the caps extend generally above the areas defined by the surface extent of the chips. Such caps are normally constituted of a heat-conductive material, such as steel or copper. Other types of caps may incorporate multiple layers of different materials or have fins formed thereon providing enlarged surface areas for dispersing and dissipating heat, whereas other structures may have the caps extending beyond the confines of the chip and be suitably shaped to theoretically optimize the rate of heat dissipation from the module arrangements.

Alcoe et al U.S. Pat. No. 5,877,043, which is commonly assigned to the assignee of the present application, discloses an electronic package incorporating a flexible substrate, stiffener and semiconductor chip. In that instance, there are provided a plurality of strain relief structures at various locations about the package so as to prevent surface wrinkling associated with large differences in coefficients of thermal expansion (CTE) between the various package elements. Although this provides for a heat dissipation structure, there is no disclosure of a unique cap design analogous to that contemplated by the present invention.

Tokuno et al U.S. Pat. No. 5,777,847 discloses a multichip module including a metallic cover plate fastened by means of a support pillar to a substrate, and wherein the plate is constituted of a heat conductive material, preferably such as copper or other suitable metal, such as aluminum or aluminum alloy.

Marrs U.S. Pat. No. 5,485,037 discloses a heat sink in the form of a cap or cover structure arranged above semiconductor chip which is mounted on a substrate, and which includes a plurality of holes adapted to be filled with a suitable filler material facilitating the dissipation of heat in a generally uniformly dispersed manner across the surface of the chip while maintaining the essential rigidity or stiffness of the heat sink or cap.

Baska et al U.S. Pat. No. 5,745,344 discloses a heat-dissipating apparatus including spaced fins for absorbing heat generated by an electronic device.

Liberty et al U.S. Pat. No. 5,213,868 is directed to a thermally conductive interface material of a polymeric binder and one or more thermal filters so as to form a heat sink for an electronic component.

Caletka et al U.S. Pat. No. 6,104,093 discloses a thermally enhanced and mechanically balanced flip chip package and method of forming the package. However, unlike the present invention, the description of recesses in this patent resides in the context of peripheral steps, and further non-flat; i.e. varying thickness cross-section. This patent does not teach nor suggest the use of small-sized apertures to promote adhesion, but rather promotes adhesion by enrichment of surface chromium and use of silane coupling agents rather than small-sized apertures.

Other types of structures which have been employed as heat sinks and which are arranged above encapsulated semiconductor chips and fastened thereto with the intermediary of epoxy adhesives, which may include heat conductive greases, including cap configurations incorporating pluralities of holes in varying specified sizes and arrays, and also scallops formed along the edges of the caps extending over the edge portions of the chips located therebeneath so as to allow for improved degrees of heat dissipation therefrom.

Although the foregoing types of cap or cover construction forming heat sinks are adapt in dissipating heat from the semiconductor chips and ball grid arrays, so as to reduce or possibly eliminate warpage encountered between the various electronic package components; in effect, the substrate mounting the semiconductor chips and the caps or cover structures forming the heat sink mounted above the chips to reduce warpage and potential failure of the ball grid arrays and the entire package modules, pursuant to the invention further improvements in design and construction would still further enhance the degree of heat dissipation through the caps so as to assist in eliminating warpage between the components and improve upon operational reliability, while increasing the service life of the package module or arrangement.

SUMMARY OF THE INVENTION

In order to improve upon the current state-of-the-art in the design and construction of cap structures which will extensively reduce or obviate delamination thereof from an adhesive or dielectric material bonding the cap structure to a chip; in effect, improving the interfacial adhesion therebetween, the cap structure is provided with a multiplicity of small-sized perforations forming increased surface areas for the bonding and creating of mechanical interlocking means between the components. The perforations which are provided in the cap structure, the latter of which is preferably of a flat or planar configuration, and wherein the perforations extend therethrough or at least partially thereinto, may be formed through a photolithography process and chemical etching.

An important advantage derived by the provision of a multiplicity of small apertures, which may be either in the form of straight uniformly dimensioned perforations, tapered holes, reversely tapered holes, blind holes or scalloped holes or recesses facing towards the adjacent chip surface, resides in that the numerous small holes or perforations considerably increase the surface areas for bonding in the absence of significantly reducing the mechanical stiffness and strength of the cap structure.

Another advantageous aspect of the inventive perforated cap structure may be ascertained in that, although the primary function resides in preventing warpage by balancing the extents of the thermal expansion of the superimposed layers of the components, it also serves a function as a heat spreader. In effect, the cap structure possesses some thermal conductivity, and may thus be imparted the properties of a thermally conductive member aiding in the dissipation of heat from the package or module.

In particular, pursuant to the invention, there is contemplated the provision of a novel heat-dissipating cap structure mounted above an encapsulated chip of an electronic package, wherein the cap preferably extends beyond the edges or confines of the chip, and may be essentially constituted of a flat or planar plate structure. Preferably, pursuant to one inventive aspect, the cover or caps is constituted of an extensively perforated metallic material of non-woven construction imparting a somewhat mesh-like characteristic thereto which will improve resistance to delamination between the encapsulant, such as an epoxy and the cap, causing only a slight reduction in the bending stiffness of the cap while concurrently maintaining the in-plane stiffness of the cap to an essentially high degree.

Pursuant to another aspect of the invention, it is also possible to contemplate that the heat-dissipating cap may be constructed with a plurality of perforations forming adhesive-filled holes or interstices arranged along the edge regions of the chip, and with other perforations of selectively varying sizes and patterns being optionally dispersed over the other surface regions of the cap, and optionally with selectively smaller and/or larger sized perforations of other types being dispersed over the cap area extending over the chip surface structure.

According to another embodiment of the invention, it is possible to provide the cap with perforations or recesses in the form of scallops and the like facing towards the surface of the chip, and which only partially extend through the thicknesses of the cap, thereby enabling the partially-through perforations and/or scallops to be at least partially filled with epoxy adhesive or bonding material so as to assist in the mechanically locking interconnection between the cap structure and the chip. Such scallops or partially-through extending blind perforations may be arranged around the perimeter or edge regions of the chip, or other suitably selected areas over the cap surface, as required by particular physical applications in order to facilitate an enhanced adhesive connection between the various package components while concurrently maintaining the strength of the cap, and thereby prevent any delamination-causing warpage taking place between the components of the package or module.

Accordingly, it is an object of the present invention to provide a novel perforated cap structure for reducing warpage encountered between the components of a semiconductor package module caused by different coefficients of thermal expansion (CTE) among the various module components.

A more specific object resides in the provision of a novel heat-dissipating perforated, mesh-like cap structure for an encapsulated semiconductor chip package structure wherein the cap is formed of a metallic material.

Still another object of the present invention is to provide a structure for reducing the warpage of components of a coupled cap ball grid array or flip chip package so as to reduce interfacial stresses through the provision of a novel perforated cap structure providing for enhanced mechanical interlocking through an adhesive filling the perforations, and compensating for different coefficients of thermal expansion between the various components.

Still another object is to provide a method for reducing the warpage of flip chip or ball grid array semiconductor packages having coupled cap-chip structures through the formation of uniquely configured perforations in the cap which enable the enhanced mechanical interlocking between the components in that the perforation from increased surface areas by bonding through an adhesive encapsulant.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF PREFERRED EMBODIMENT

Figure 1:
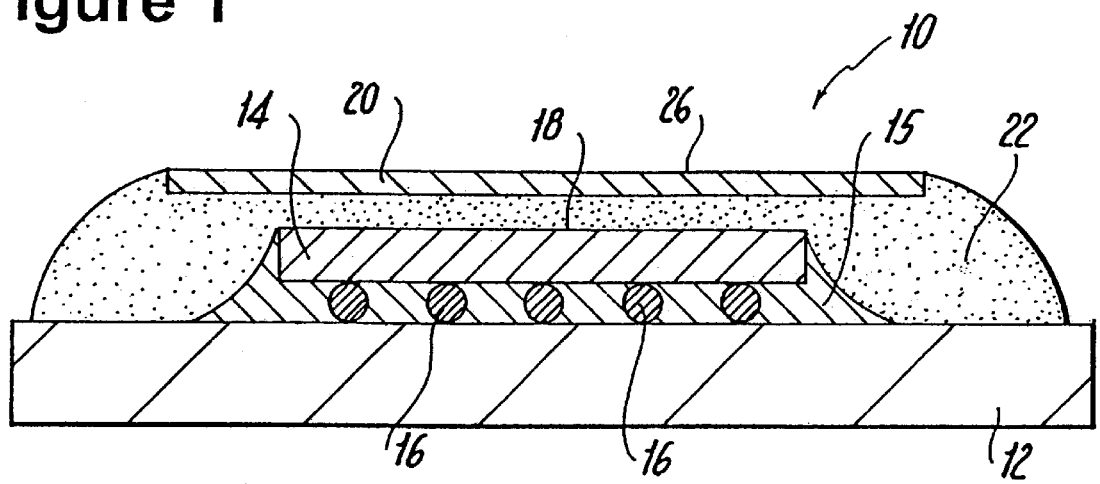
FIG. 1 illustrates, generally diagrammatically, a side elevational view of a semiconductor chip package incorporating the novel perforated cap structure pursuant to the invention.

Reverting in detail to the drawings, and more particularly to FIG. 1, there is disclosed a semiconductor chip package or a module 10 which essentially comprises a circuitized substrate 12, which may be constituted of an organic material or laminate. Positioned above the circuitized substrate 12 is a semiconductor chip 14, and is electrically coupled to the substrate 12 through the intermediary of, for instance; solder ball interconnection (C4) 16, and with underfill 15 between components 12 and 14, as shown.

In turn, positioned above the semiconductor chip 14 so as to face the surface 18 of the latter in closely spaced relationship is a cover or cap structure 20, which is essentially constituted of a flat plate member, preferably of rectangular configuration.

Figure 2:
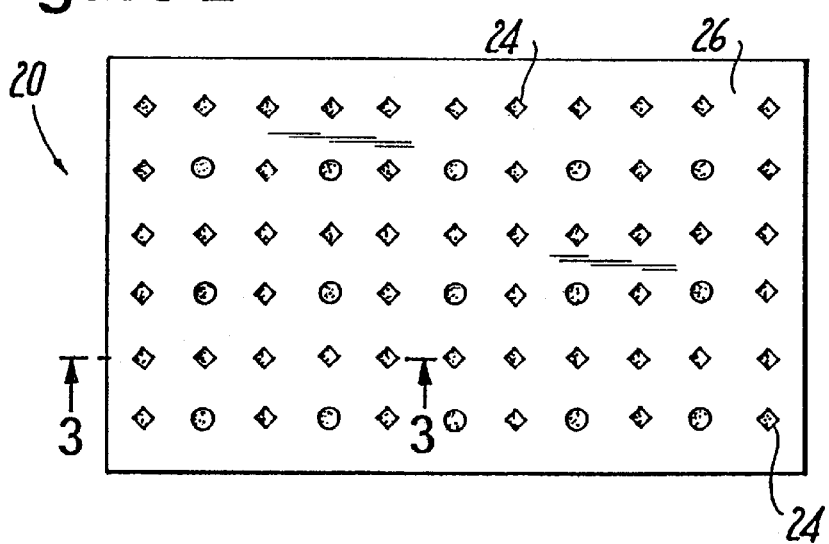
FIG. 2 illustrates top plan view of a perforated cap structure which is constituted of a thermally conductive member pursuant to the invention.

As illustrated in FIG. 2, in order to provide an enhanced degree of mechanical interlocking or bonding between the components of the electronic package 10, the components are encapsulated by a rigid dielectric material 22, such as an adhesive, as is well known in the technology.

Figure 3:
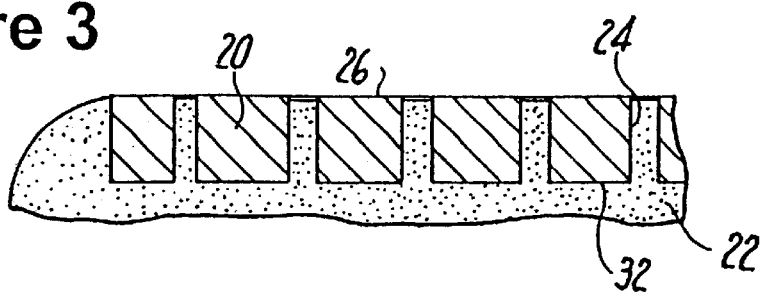
FIG. 3 illustrates, on an enlarged scale, a sectional view through the cap structure taking along line A—A in FIG. 2, showing a first embodiment of typical perforations formed therein.

In order to improve upon the physical interlocking or mechanical interconnection between the cap structure 20, which may act as a heat sink or thermally heat-dissipating member, the latter is provided with selectively arranged, sizes and types of perforations or recesses, which are adapted to be at least partially filled with the adhesive, as described hereinbelow. As illustrated in the embodiment of FIGS. 2 and 3 of the drawings, the cap structure 20 is provided with a multiplicity of small-sized perforations 24 extending therethrough. These perforations may be located either in a suitable array extending over the entire surface of the cap member 20, or alternatively, may be only located in specific regions thereof, for example such as areas above the confines of the semiconductor chip 14, or along the edges above and/or outwardly of the periphery of the semiconductor chip 14.

The thermally conductive cap structure 20 is firmly anchored in a more secure position over the semiconductor chip 14 in that the dielectric material, such as adhesive 22 is enabled, during manufacture, to flow into the confines of the perforations 22, until filling or at least partially filling the latter up to the plane of the upper surface 26 of the cap member 20.

This particular aspect of at least partially filling the small-sized perforations 24, which impart a somewhat mesh-like appearance to the cap structure with the dielectric material adhesive 22, enhances the interfacial adhesion of the encapsulating adhesive which bonds the cap structure 20 to the chip 14 by the at least partial filling of the perforations therewith. In this particular instance, in effect the embodiment of FIG. 3 of the drawings, the perforations 24 are each basically of a uniform or constant diameter throughout the thickness of the cap structure 20.

The apertures in the cap 20 may be formed by various processes, including mechanical drilling or punching, laser drilling, or photolithographic etching. The exact size of the holes can range from about 1 mil to about 20 mils, with the most preferable size being about 5 mils. The optimal hold diameter depends upon the rheological properties of the adhesive 22, and the wettability of the cap structure 20. In the event that blind holes or recesses are used, entrance or hole inlet diameters can range from about 1 to 20 mils, with the most preferable size being about 5 mils. The spacing between the holes that is most preferable for the holes is within the range of about 2 to 10 multiples of the hole diameter. More tightly spaced holes would result in a more significant drop in the bending stiffness of the cap 20, and wider spacings would reduce the improved adhesion due to increased surface contact between adhesive 22 and cap 20.

Figure 4:
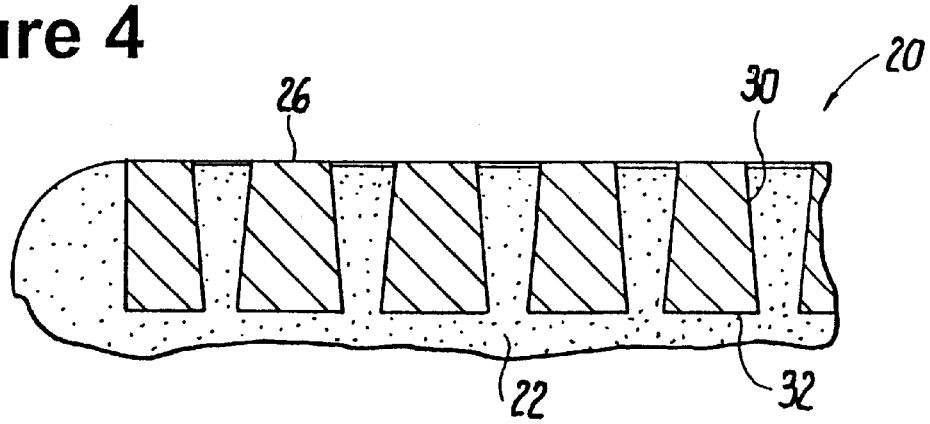
FIG. 4 illustrates a view of a further embodiment similar to FIG. 3 showing modified perforations which are tapered so as upwardly widen through the thickness of the cap structure.

Alternatively, as shown in the embodiment of FIG. 4 of the drawings, the perforations 30 in the cap structure 20 may be tapered so as to be upwardly widening; in essence towards the upper surface 26 from the lower surface 32 of the cap structure 20 facing the surface 18 of the semiconductor chip 14.

Figure 5:
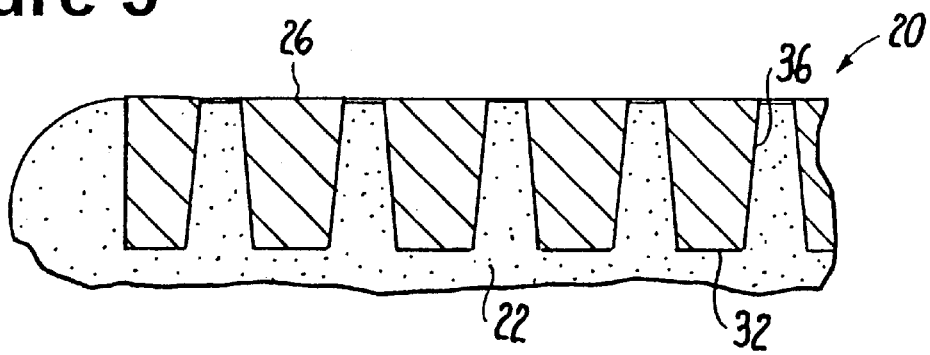
FIG. 5 illustrates a view of another embodiment similar to FIG. 4, with the tapered perforations being reversed within the cap structure so as to widen towards the lower surface thereof facing the semiconductor chip.

Conversely, as shown in the embodiment of FIG. 5 of the drawings, the tapered holes 36 in the cap structure 20 may be reversely tapered, in effect, widening towards the lower cap surface 32, which faces the adjacent surface 18 of the semiconductor chip 14.

Figure 6:
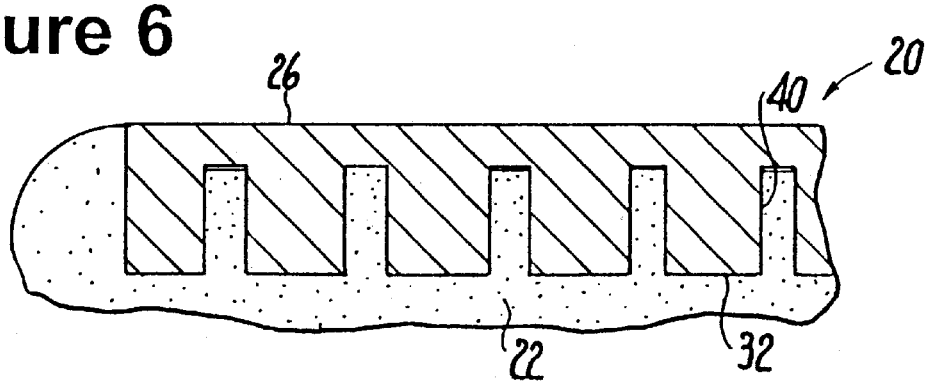
FIG. 6 illustrates a sectional view showing an embodiment in the formation of blind holes in the cap structure surfacing the chip, taken along line A—A in FIG. 2.

In the embodiment of FIG. 6 of the drawings, rather than providing for through-extending perforations, such as those shown in the embodiment of FIGS. 3, 4 and 5, which impart a mesh-like appearance to the cap structure, in this instance, the latter is provided with an array of small-sized blind holes 40, as previously mentioned each having entrance or hole inlet diameters which range from about 1 to 20 mils, and preferably extending upwardly into the cap structure 20 from the lower surface 32 which faces the surface 18 of the semiconductor chip 14, so as to be able to be at least partially filled with the adhesive and enhance the mechanical interlocking between the components, while the upper surface 26 of the cap structure presents a smooth, unbroken surface area.

Figure 7:
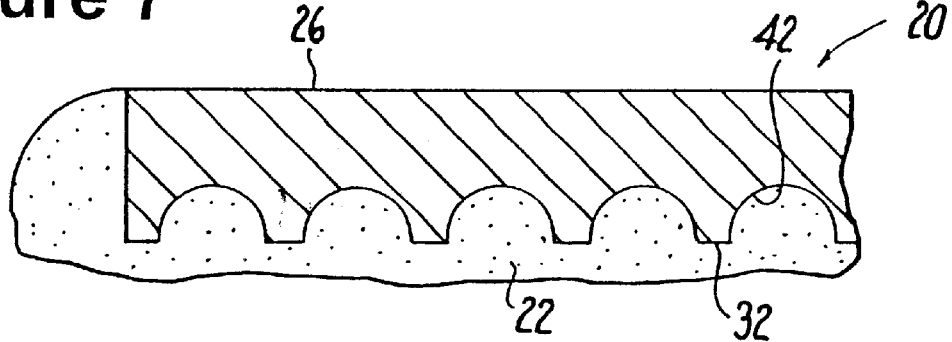
FIG. 7 illustrates a sectional view showing an embodiment similar to FIG. 6, with scalloped holes or recesses being formed in the cap structure surface facing the semiconductor clip.

In the embodiment of FIG. 7 of the drawings, the cap structure 20 is provided with recesses 42, preferably in the form of arrays of scallops, formed in the surface 32 facing the surface 18 of the semiconductor chip 14. The scalloped recesses or holes 42 are adapted to be at least partially filled with the adhesive; i.e. the rigid dielectric material 22 forming the encapsulant for the package 10, so as to enhance the mechanical engagement or interlocking between the package components, and the coupling of the cap structure 20 to the module.

Preferably, the perforations and/or recesses 24, 30, 36, 40 and 42 are produced by utilizing suitable photolithography processes and chemical etching, which enables the formation of numerous small perforations and/or holes and scalloped recesses in the cap structure 20 to significantly increase the surface area available for the bonding between the components through intermediary of the adhesive 24 without significantly reducing the mechanical stiffness or strength of the cap structure.

The foregoing process may also be utilized through the use of a photoresist and a masking procedure where the photoresist protects some areas of the cap structure, and chemical etching forms the perforations, whereupon subsequently the photoresist is removed.

Preferably, although not necessarily the cap structure 20 is constituted of steel, although other metallic materials would also be applicable to providing the perforated cap pursuant to the present invention.

Pursuant to a further aspect, the function of the cap structure 20 will prevent warpage by balancing the thermal expansion of the package or module layers during heating, and may provide a function as a heat spreader possessing some degree of thermal conductivity, so as to be essentially considered a thermally conductive member.

From the foregoing, it becomes clearly apparent that the novel arrangement of small-sized perforations, holes and scalloped recesses in the cap structure 20 which significantly increases the bonding surface areas available for the dielectric material, such as an adhesive 22, enhances the strength of the entire module or electronic package 10 while concurrently inhibiting warpage thereof so as to inhibit delamination between the cap structure 20 and the semiconductor chip 14 due to thermally caused thermal stresses.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. An electronic package, comprising:
   a circuitized substrate having an upper surface;
   a semiconductor chip mounted on said upper surface of said circuitized substrate and electrically coupled to said substrate, said semiconductor chip having a substantially planar upper surface and at least one edge surface being substantially perpendicular to said substantially planar upper surface;
   a thermally conductive member being provided with an array of perforations and having upper and lower surfaces, said lower surface of said thermally conductive member being thermally coupled to said substantially planar upper surface of said semiconductor chip, said thermally conductive member further having at least one edge surface extending around a defined perimeter of said thermally conductive member; and
   a substantially rigid dielectric material positioned on at least a portion of said circuitized substrate, against at least a portion of said at least one edge surface of said thermally conductive member, and against at least a portion of said at least one edge surface of said semiconductor chip, and said dielectric material being at least partially filled into said perforations so as to enhance the mechanical interlocking between said thermally conductive member and said semiconductor chip.

2. An electric package as claimed in claim 1, wherein said thermally conductive member comprises a metallic material.

3. An electronic package as claimed in claim 1, wherein said thermally conductive member extends beyond the peripheral configures of said semiconductor chip.

4. An electronic package as claimed in claim 1, wherein said perforations comprises holes extending through the thickness of said thermally conductive member.

5. An electronic package as claimed in claim 1, wherein said perforations comprise blind holes formed in the lower surface of said thermally conductive member.

6. An electronic package as claimed in claim 1, wherein said perforations comprise scalloped recesses formed in the lower surface of said thermally conductive member.

7. An electronic package as claimed in claim 1, wherein said perforations are formed by a photolithography process and employing chemical resists on said thermally conductive member.

8. An electronic package as claimed in claim 2, wherein said metallic material consists of steel.

9. An electric package as claimed in claim 3, wherein said thermally conductive member is a plate structure of substantially uniform thickness.

10. An electronic package as claimed in claim 4, wherein each of said holes has a diameter within the range of about 1 to 20 mils.

11. An electronic package as claimed in claim 4, wherein the spacing between each of said holes is within a range of 2 to 10 times the size of the hold diameter.

12. An electronic package as claimed in claim 4, wherein said perforations are each of a constant diameter through said thermally conductive member.

13. An electronic package as claimed in claim 4, wherein said perforations each comprise a tapered hole widening towards the upper surface of said thermally conductive member.

14. An electronic package as claimed in claim 4, wherein said perforations each comprise a tapered hole widening towards the lower surface of said thermally conductive member.

15. An electronic package as claimed in claim 10, wherein each of said holes has a diameter of about 5 mils.

16. An electronic package as claimed in claim 5, wherein each of said blind holes have an inlet diameter within the range of about 1 to 20 mils.

17. An electronic package as claimed in claim 5, wherein the spacing between each of said blind holes is within a range of about 2 to 10 times the size of the inlet diameter of said blind holes.

18. An electronic package as claimed in claim 16, wherein each of said blind holes has an inlet diameter of about 5 mils.

19. A method of producing an electronic package, comprising:
   providing a circuitized substrate having an upper surface;
   mounting a semiconductor chip on said upper surface of said circuitized substrate so as to be electrically coupled to said substrate, said semiconductor chip having a substantially planar upper surface and at least one edge surface being substantially perpendicular to said substantially planar upper surface;
   providing a thermally conductive member which is perforated with an array of small-sized apertures and having upper and lower surfaces, said lower surface of said thermally conductive member thermally coupled to said substantially planar upper surface of said semiconductor chip, said thermally conductive member further having at least one edge surface extending around a defined perimeter of said thermally conductive member; and
   having a substantially rigid dielectric material positioned on at least a portion of said circuitized substrate, against at least a portion of said at least one edge surface of said thermally conductive member, and against at least a portion of said at least one edge surface of said semiconductor chip; said dielectric material at least partially filling said perforations to form a mechanical locking between said thermally conductive member and said chip.

20. A method as claimed in claim 19, wherein said perforated thermally conductive member comprises a metallic material.

21. A method as claimed in claim 19, wherein said thermally conductive member extends beyond the peripheral configures of said semiconductor chip.

22. A method as claimed in claim 19, wherein said perforations comprises holes extending through the thickness of said thermally conductive member.

23. A method as claimed in claim 19, wherein said perforations are each of a constant diameter through said thermally conductive member.

24. A method as claimed in claim 19, wherein said perforations each comprise a tapered hole widening towards the upper surface of said thermally conductive member.

25. A method as claimed in claim 19, wherein said perforations each comprise a tapered hole widening towards the lower surface of said thermally conductive member.

26. A method as claimed in claim 19, wherein said perforations comprise blind holes formed in the lower surface of said thermally conductive member.

27. A method as claimed in claim 19, wherein said perforations comprise scalloped recesses formed in the lower surface of said thermally conductive member.

28. A method as claimed in claim 19, wherein said perforations are formed by a photolithography process and employing chemical resists on said thermally conductive member.

29. A method as claimed in claim 20, wherein said metallic material consists of steel.

30. A method as claimed in claim 21, wherein said thermally conductive is a plate structure of substantially uniform thickness.

31. A method as claimed in claim 22, wherein each of said holes has a diameter within the range of about 1 to 20 mils.

32. A method as claimed in claim 22, wherein the spacing between each of said holes is within a range of 2 to 10 times the size of the hole diameter.

33. A method as claimed in claim 31, wherein each of said holes has a diameter of about 5 mils.

34. A method as claimed in claim 26, wherein each of said blind holes have an inlet diameter within the range of about 1 to 20 mils.

35. A method as claimed in claim 26, wherein the spacing between each of said blind holes is within a range of about 2 to 10 times the size of the inlet diameter of said blind holes.

36. A method as claimed in claim 34, wherein each of said blind holes has an inlet diameter of about 5 mils.

* * * * *